(12) United States Patent
Chen

(10) Patent No.: US 7,659,596 B2
(45) Date of Patent: Feb. 9, 2010

(54) LATERAL HIGH-VOLTAGE DEVICES WITH OPTIMUM VARIATION LATERAL FLUX BY USING FIELD PLATE

(75) Inventor: Xingbi Chen, Chengdu (CN)

(73) Assignee: University of Electronic Science & Technology, Cheng du, Sichuan (CN)

( * ) Notice: Subject to any disclaimer, the term of this patent is extended or adjusted under 35 U.S.C. 154(b) by 64 days.

(21) Appl. No.: 11/753,930

(22) Filed: May 25, 2007

(65) Prior Publication Data
US 2008/0067624 A1    Mar. 20, 2008

(30) Foreign Application Priority Data
Sep. 19, 2006 (CN) .................. 2006 1 0138829

(51) Int. Cl.
*H01L 23/58* (2006.01)
(52) U.S. Cl. ................................................ 257/492
(58) Field of Classification Search ........... 257/603, 257/605–606, 122, 287, 487–496, 341, 401, 257/500, 502, 578, 691, E23.257, E21.38
See application file for complete search history.

(56) References Cited

U.S. PATENT DOCUMENTS

| | | | | |
|---|---|---|---|---|
| 6,724,021 B2* | 4/2004 | Van Dalen et al. | ........... | 257/213 |
| 6,828,645 B2* | 12/2004 | Jimbo et al. | ................ | 257/488 |
| 2004/0041237 A1* | 3/2004 | Chen | ......................... | 257/603 |

* cited by examiner

*Primary Examiner*—Dao H Nguyen
*Assistant Examiner*—Tram H Nguyen
(74) *Attorney, Agent, or Firm*—Locke Lord Bissell & Liddell, LLP

(57) ABSTRACT

A semiconductor lateral voltage-sustaining region and devices based thereupon. The voltage-sustaining region is made by using the Metal-Insulator-Semiconductor capacitance formed by terrace field plate to emit or to absorb electric flux on the semiconductor surface, so that the effective electric flux density emitted from the semiconductor surface to the substrate approaches approximately the optimum distribution, and a highest breakdown voltage can be achieved within a smallest distance on the surface. The field plate(s) can be either connected to an electrode or floating ones, or connected to floating field limiting rings. Coupling capacitance between different plates can also be used to change the flux distribution.

9 Claims, 14 Drawing Sheets

LATERAL HIGH-VOLTAGE DEVICES WITH OPTIMUM VARIATION LATERAL FLUX BY USING FIELD PLATE

FIELD OF THE INVENTION

The present invention relates to semiconductor devices. More specifically, the present invention relates to the lateral voltage-sustaining region, also called surface voltage-sustaining region, i.e., the drift region of lateral high-voltage devices. The present invention also relates to edge termination techniques of semiconductor high-voltage vertical devices.

BACKGROUND OF THE INVENTION

It has been pointed out in Ref. [1, 2], that one can use optimum variation lateral doping, shortly as VLD, to achieve highest breakdown voltage within a minimum distance on the surface. The breakdown voltage reached by using such method is close to the breakdown voltage of a one-sided abrupt parallel plane junction made by the same substrate. Furthermore, the methods of implementation of high-side devices as well as low-side devices by using optimum VLD were proposed in references [4, 5].

It has been proposed in Ref. [3] that the idea of optimum VLD, in its substantial physical mechanism, should be changed to optimum VLF, where F stands for flux density. A method to realize an optimum VLF has also been proposed in Ref. [3]. This method includes a film of high permittivity material covering on the semiconductor surface.

However, most popular technologies of integrated circuits are CMOS and BiCMOS technologies, and in such technologies, few can provide the necessary doses as well as depths of n-type and p-type impurities required according to Ref. [2] and [3]. Not to mention, almost no technology in integrated circuits contain a process to fabricate a material of a permittivity much higher than that of the semiconductor as required in Ref. [3]. Therefore, it is interesting to find a method to realize optimum VLF in a lateral voltage-sustaining region by conventional CMOS/BiCMOS technologies so that the high-voltage or power integrated circuits can be made cost-effectively.

The present invention provides a method to realize optimum variation lateral flux density by using the multiple insulator layers and the multiple conductive layers inherently contained in the conventional CMOS/BiCMOS technologies.

REFERENCES

[1] X. B. Chen, et al., "Lateral high-voltage devices using an optimized variation lateral doping", Int. J. Electronics, Vol. 80, No. 3, pp. 449-459 (1996).
[2] X. B. Chen, U.S. Pat. No. 5,726,469 or Chinese patent ZL 95108317.1.
[3] X. B. Chen, U.S. Pat. No. 6,936,907 or Chinese patent ZL 02142183.8.
[4] X. B. Chen, U.S. Pat. No. 6,310,365 B1.
[5] X. B. Chen, U.S. Pat. No. 6,998,681 B2.

SUMMARY OF THE INVENTION

This invention is to take the advantages of the multiple insulator layers and the multiple conductive layers inherently contained in modern CMOS or BiCMOS technologies, to form a kind of terrace field plate. Since a specific capacitance between such field plates and the semiconductor surface varies with distance, it can absorb different electric flux densities from different places of the semiconductor surface, or emit different electric flux densities to different places of the semiconductor surface. Here, the specific capacitance stands for the capacitance in unit area, and therefore, it can also be changed by a fill factor of the field late. Based upon this principle, the electric flux density emitted from the surface voltage-sustaining region can be so modified that it approaches the ideal electric flux density described in Ref [3]. Thus, the surface voltage-sustaining region can yield a breakdown voltage close to that of the one-sided abrupt parallel-plane junction made by the same substrate.

The field plates can be floating, and then each of them has no electric charge as a whole. The electric flux absorbed or emitted by each field plate can be in turn offset by charging or discharging of the coupling condenser made by itself and the neighboring floating field plate. The methods of establishing such coupling condenser are also presented in this invention.

There are some possible reasons to make a floating field plate being charged. For instance, after the insulating layers have absorbed irradiation, or after some local areas have suffered to having high electric field and being breakdown. In order to eliminate such charges, one method is to connect each floating field plate to a certain floating field limiting ring. Then, when the device is turned-on with the voltage across the voltage-sustaining region being very low or when the device has not been applied any voltage, the potentials of all field plates are close to the potential of the substrate and the charges on the field plates can be released.

With the surface voltage-sustaining region using floating field plates, not only low-side high voltage lateral devices can be made, but also high-side high voltage lateral devices can be made.

This invention not only can be used to lateral devices, such as lateral MOSTs, diodes, etc., but also can be used as an edge termination technique for vertical devices.

BRIEF DESCRIPTION OF THE DRAWINGS

FIG. 1($a$) shows the structure of a lateral power device.

FIG. 1($b$) shows the relationship between the electric flux density and the distance to the location of the maximum potential.

solid line—the ideal flux density;

dash line—the flux density, $qD_0$, produced by the n-type region;

shaded area—the flux density need to be extracted from the surface (The voltage-sustaining region is divided to be four subregions, each has the same width. The average flux densities need to be extracted are represented by $\Delta F_1$, $\Delta F_2$, $\Delta F_3$ and $\Delta F_4$, respectively);

FIG. 1($c$) shows the potential distribution V(x) of the surface voltage-sustaining region in an ideal case, where the potential of the un-depleted neutral region of the p-type substrate is taken as reference voltage.

FIG. 2 shows a lateral MOST where field plates are used to absorb the electric flux from the semiconductor surface.

FIG. 2($a$) shows the structure of the lateral MOST;

FIG. 2($b$) shows the top view of the field plate, which has four different sections with different fill factor to produce four MIS capacitors with different average values;

FIG. 2($c$) shows the equivalent circuit of the field plate having four different capacitances $C_1$, $C_2$, $C_3$ and $C_4$ connected to different potential $V_1$, $V_2$, $V_3$ and $V_4$, respectively.

Figure 3:
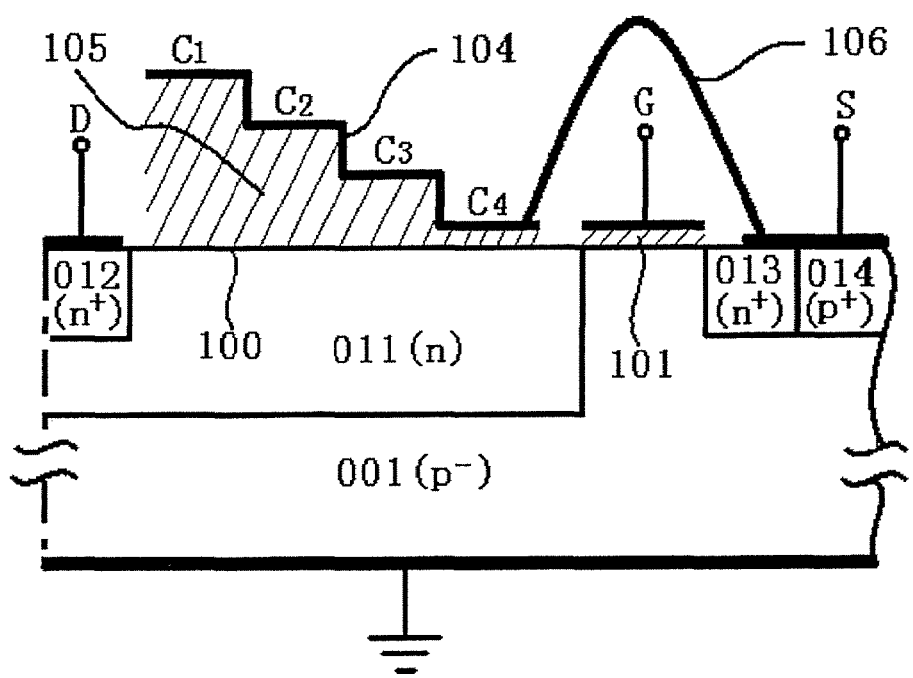

FIG. 3 shows a structure of a lateral MOST with one terrace field plate in its surface voltage-sustaining region. There are four layers with different thickness of dielectric material to separate the semiconductor and the field plate.

FIG. 4 shows some examples of lateral MOST using different floating field plates.

Figure 4A:
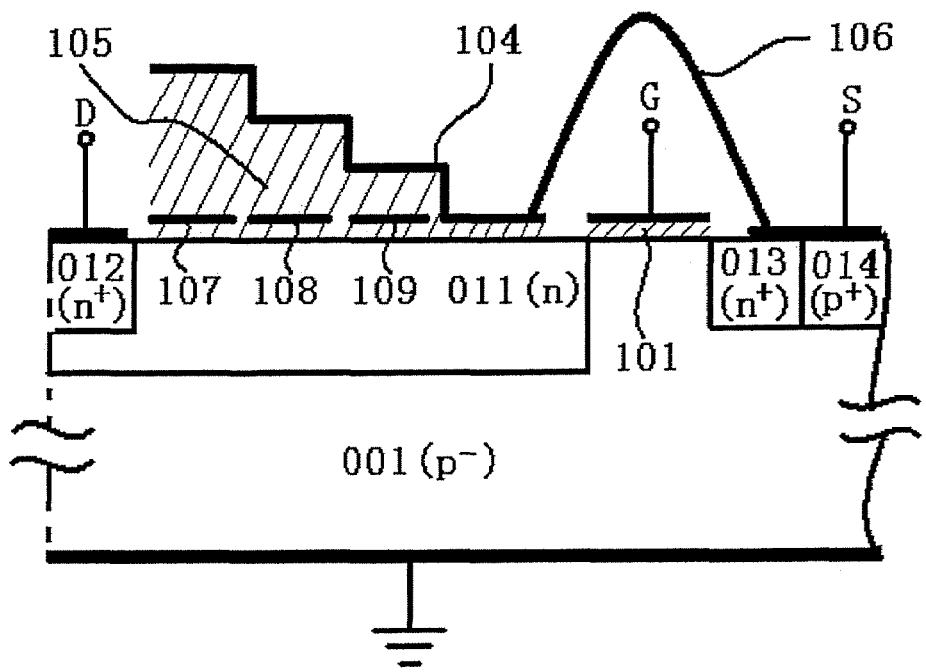

FIG. 4(a) shows one grounded terrace field plate (104) and three sections of floating field plates (107, 108 and 109) under it.

Figure 4B:
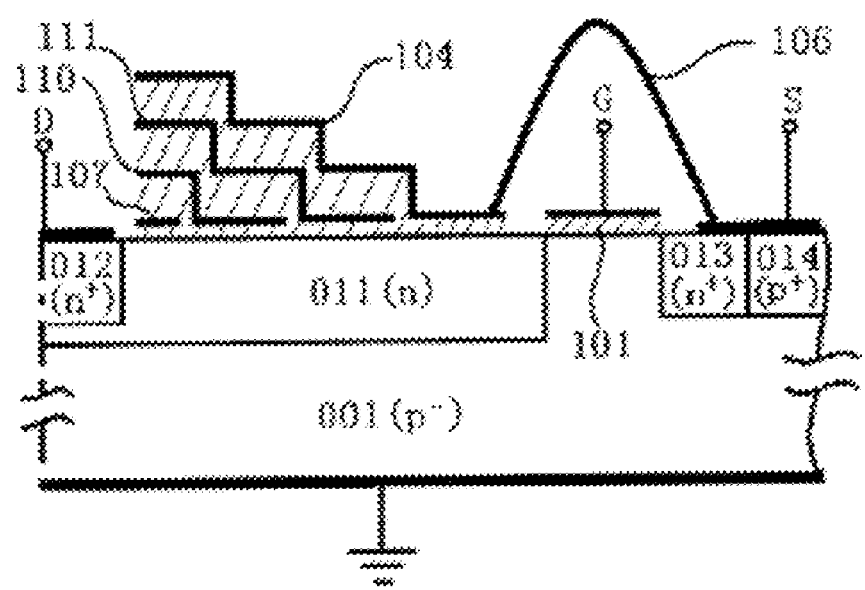

FIG. 4(b) shows one grounded terrace field plate (104) and two sections of terrace floating field plates (110 and 111) as well as one section of floating field plate (107).

Figure 5A:
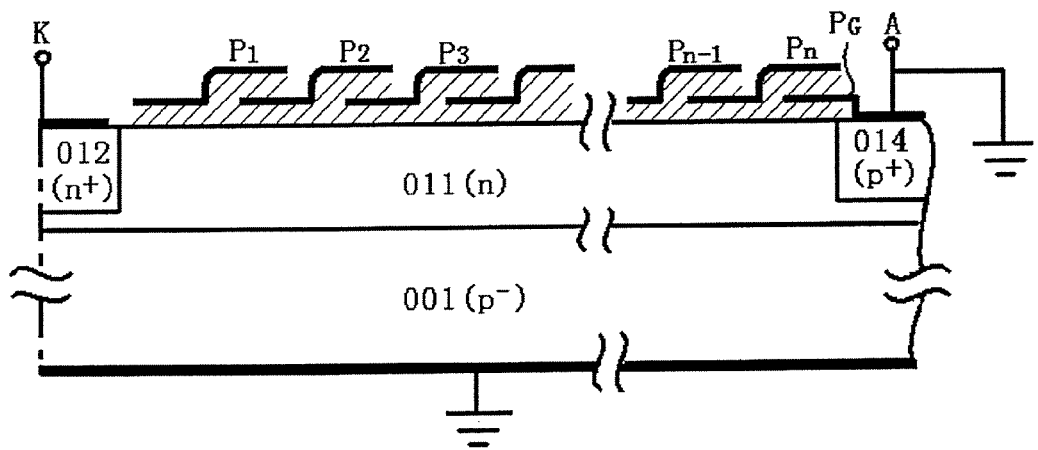
Figure 5B:
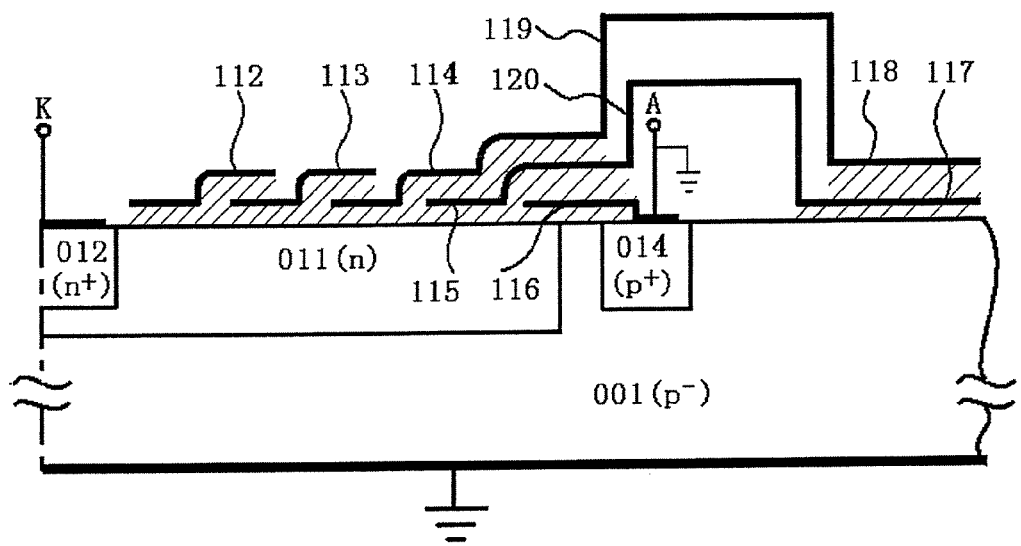
Figure 5C:
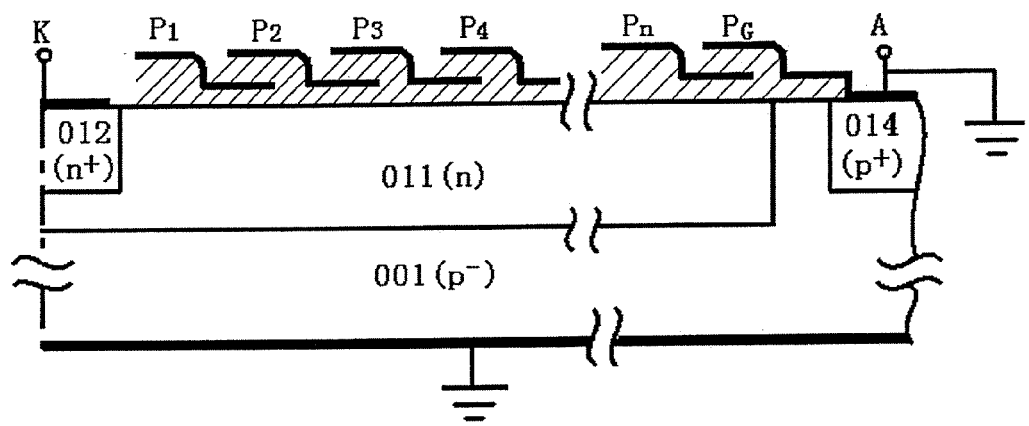

FIG. 5 shows some examples of lateral diode using multiple terrace floating field plates and one grounded field plate (Note that coupling capacitances between plates exist because there are overlap regions between plates):

FIG. 5(a) shows each terrace floating field plate are stepped up in the direction towards to the anode terminal A;

FIG. 5(b) shows a method for increasing coupling capacitance between the neighbouring floating field plates close to anode A and for increasing coupling capacitance between a floating field plate and the substrate;

FIG. 5(c) shows each terrace floating field plate is stepped down in the direction towards to the anode terminal A.

Figure 6:
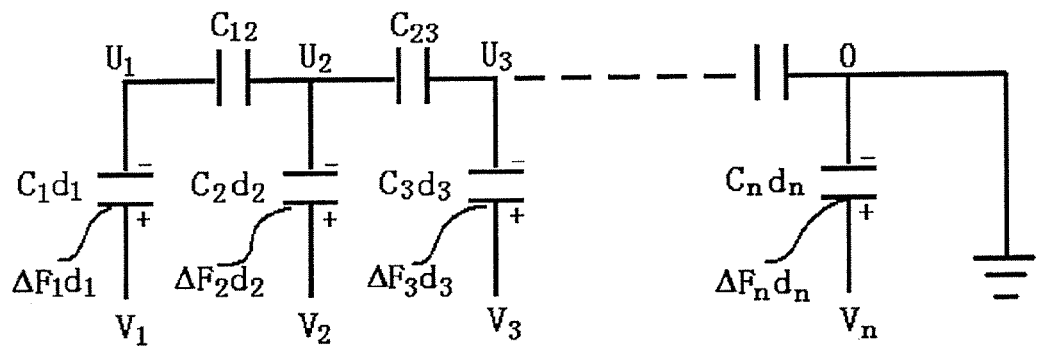

FIG. 6 shows an equivalent circuit for calculating the parameters of floating field plates shown in FIG. 5.

Figure 7A:
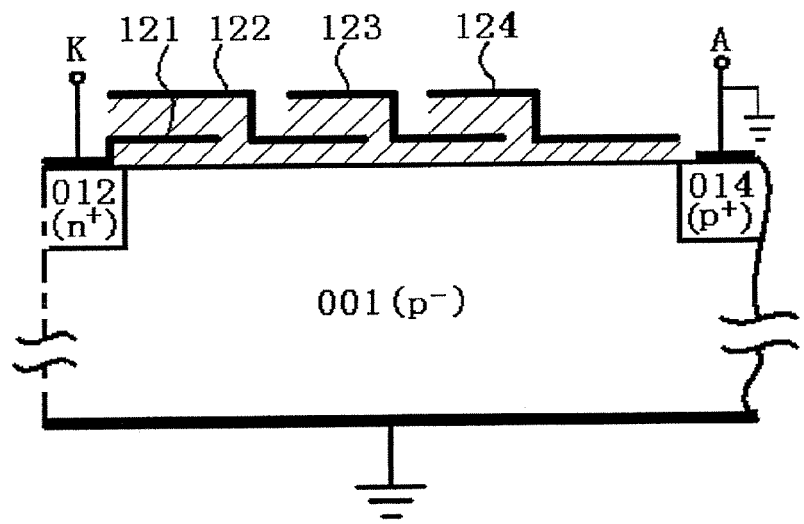
Figure 7B:
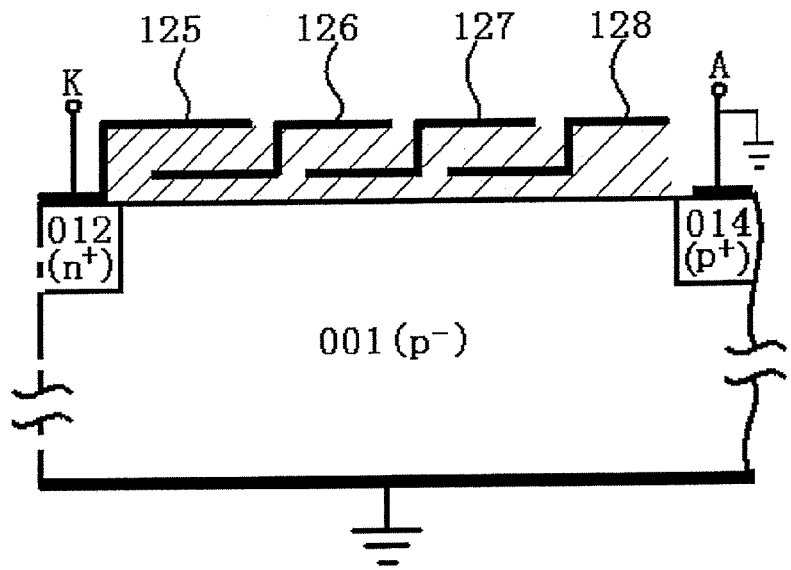
Figure 7C:
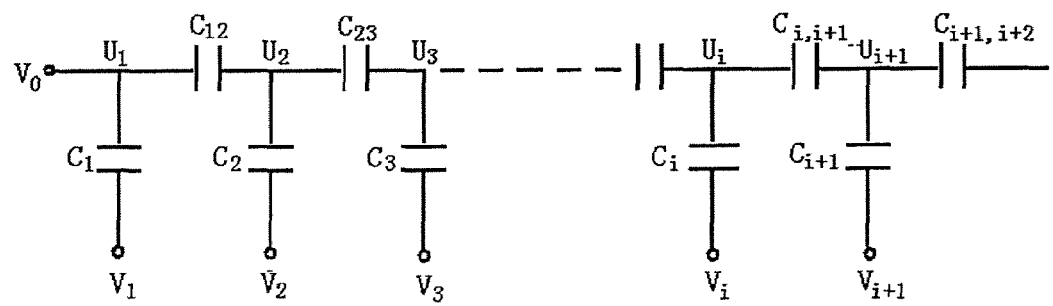

FIG. 7 shows a semiconductor lateral diode where terrace floating field plates are used to introduce electric flux to the semiconductor surface:

FIG. 7(a) shows each terrace floating field plate is stepped down in the direction towards to the anode A;

FIG. 7(b) shows each terrace floating field plate is stepped up in the direction towards to the anode A;

FIG. 7(c) shows an equivalent circuit for deriving the parameters of the floating field plates.

Figure 8A:
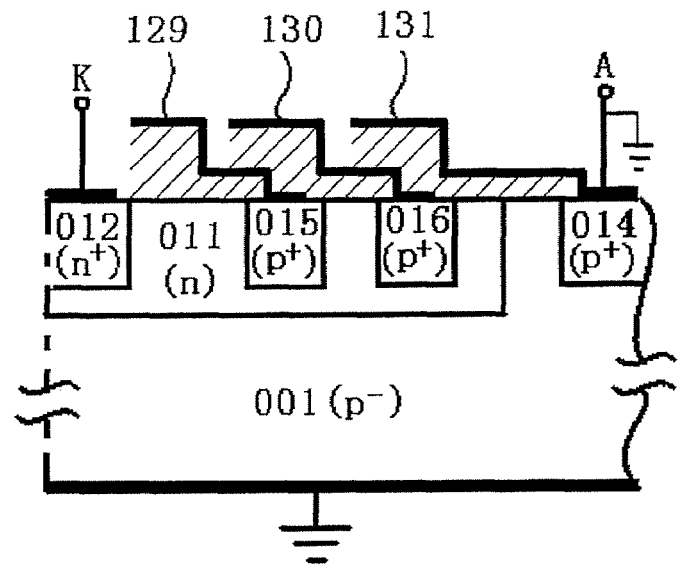
Figure 8B:
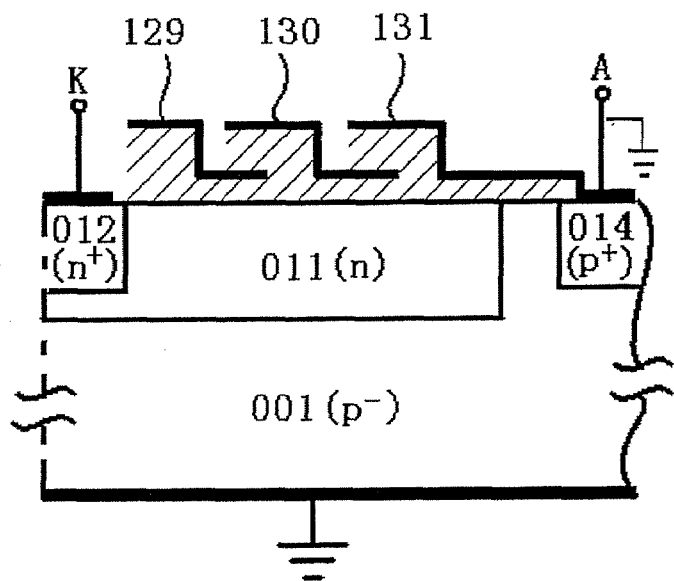
Figure 8C:
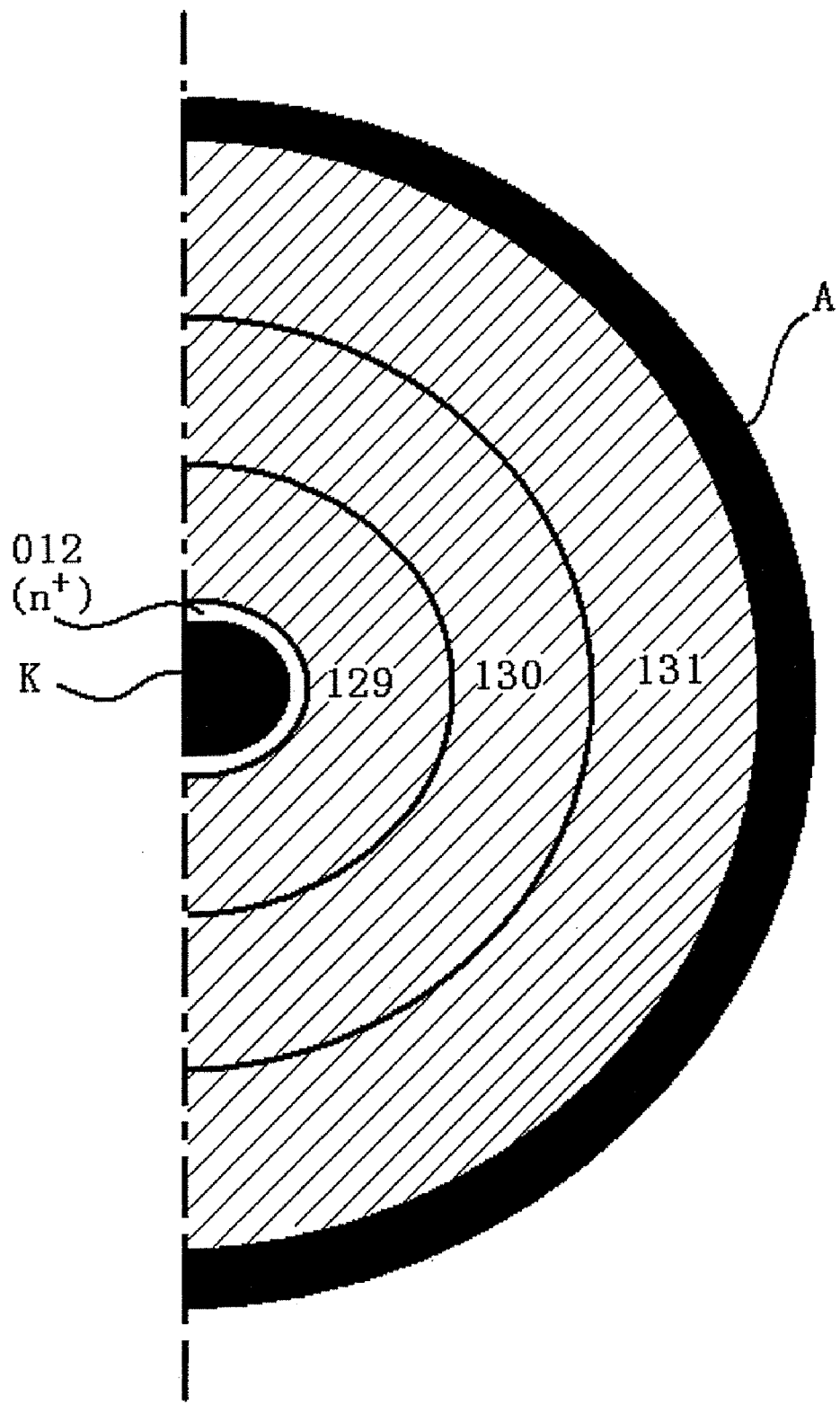

FIG. 8 shows a semiconductor lateral diode with interdigitated layout where field plates are connected to the floating field limiting rings;

FIG. 8(a) shows the structure of semiconductor lateral diode, where p$^+$-type floating field limiting rings are set in the n-type region of the voltage-sustaining region;

FIG. 8(b) shows the cross-section view of the finger edge of the interdigitated layout where no floating field limiting rings are set, FIG. 8(c) shows the top view of the finger end of the interdigitated layout where floating field limiting rings are set.

Figure 9A:
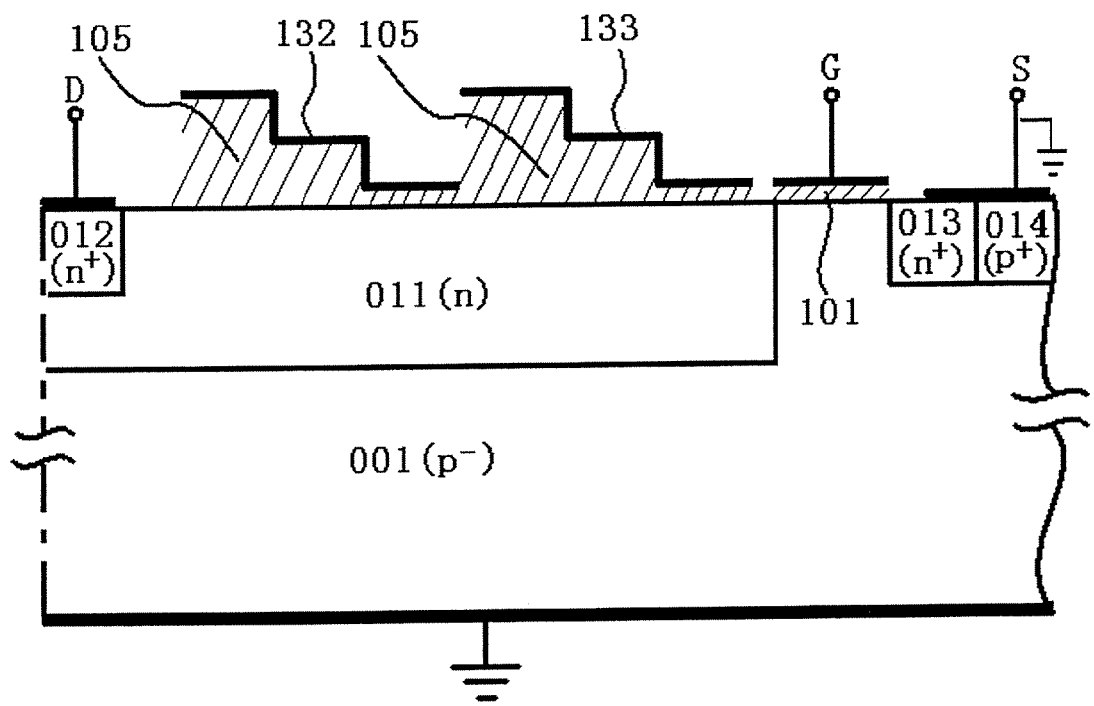
Figure 9B:
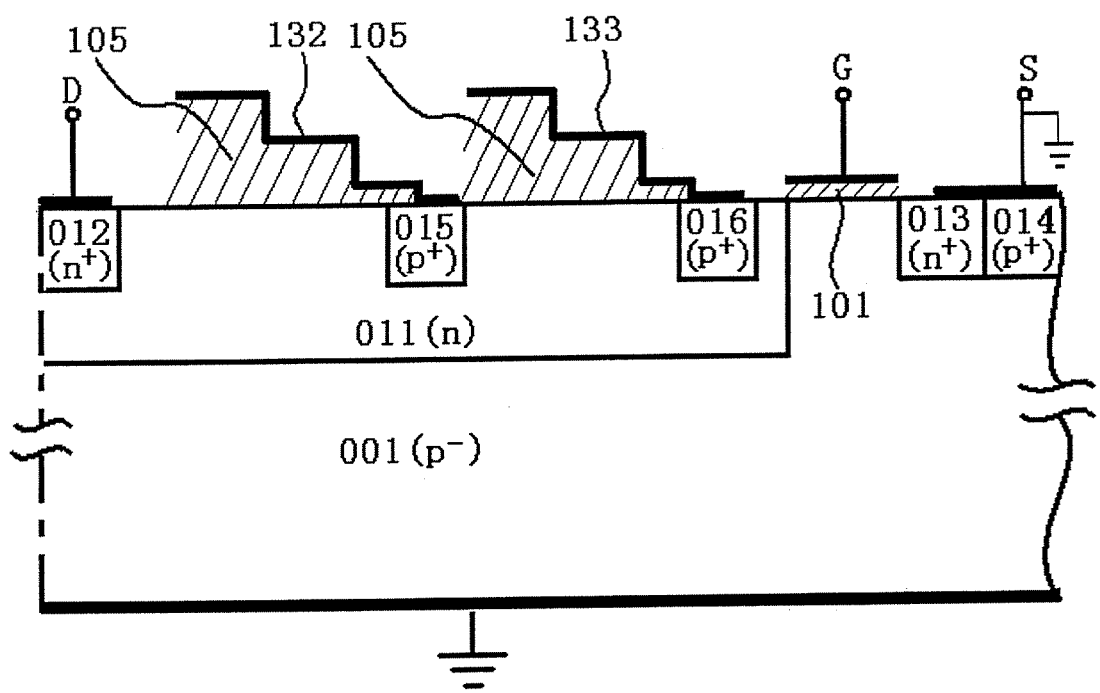

FIG. 9 shows the cross-section view of a lateral MOST with interdigitated layout having terrace field plates FIG. 9(a) shows the structure at the finger edge of the interdigitated layout;

FIG. 9(b) shows the structure at the finger end of the interdigitated layout.

Figure 10A:
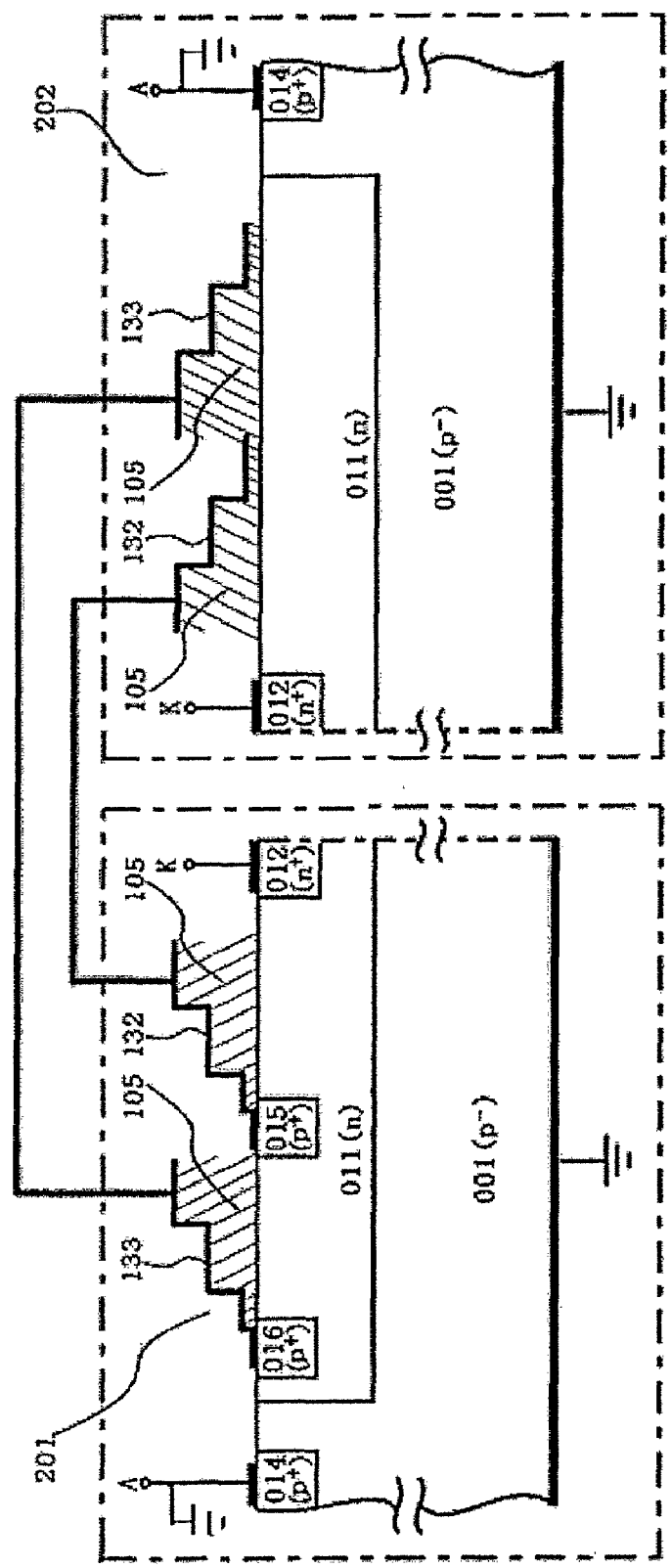

FIG. 10 shows the field plates of a device (202) having a large area connected to the field plates of a device (201) having a small area and the latter are in turn connected to the floating field limiting rings of the device 201 itself;

FIG. 10(a) shows the structures of both devices, where 201 has a small round layout and 202 has a large interdigitated layout.

Figure 10B:
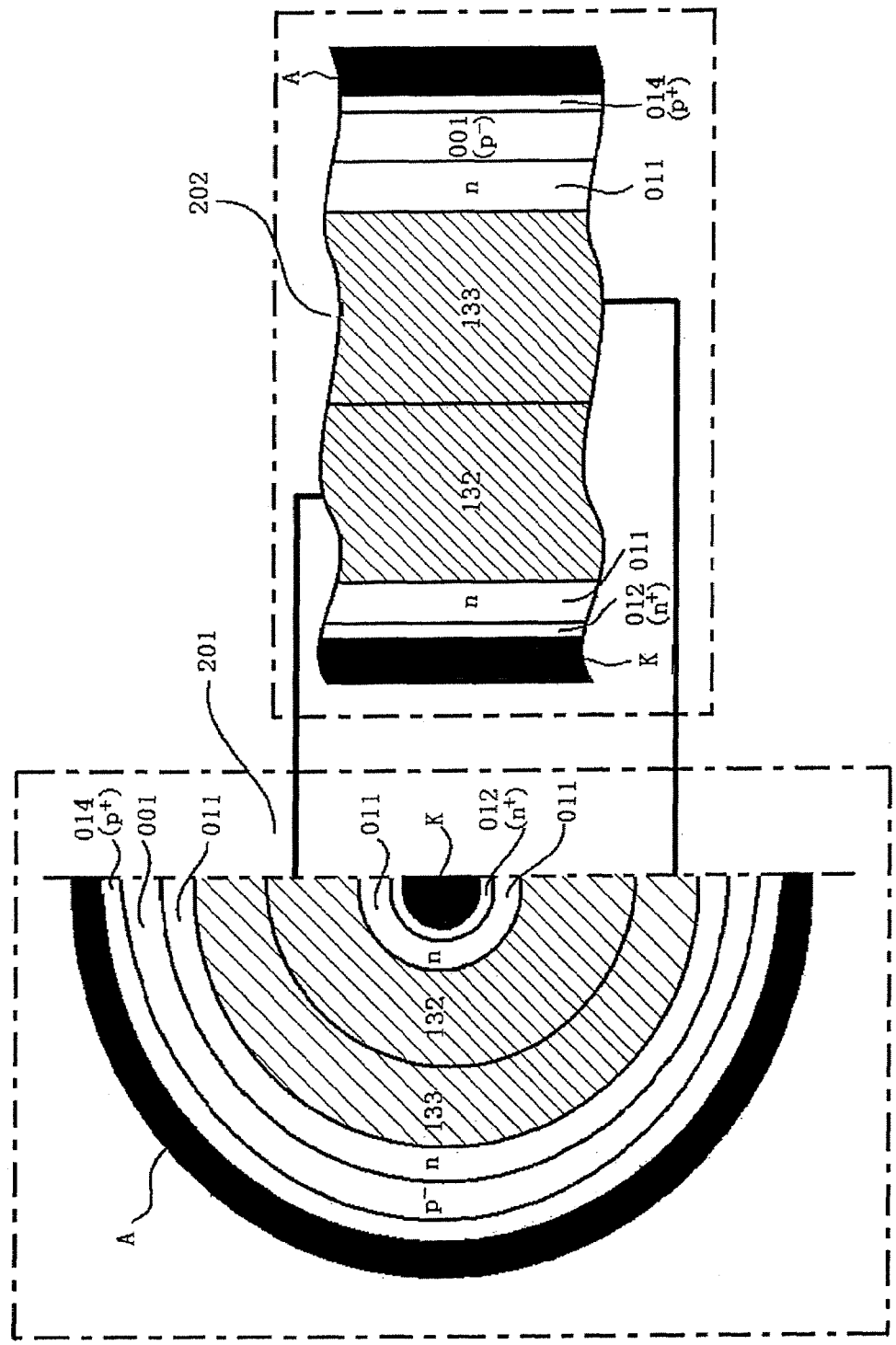

FIG. 10(b) shows the top view of both devices.

Figure 11:
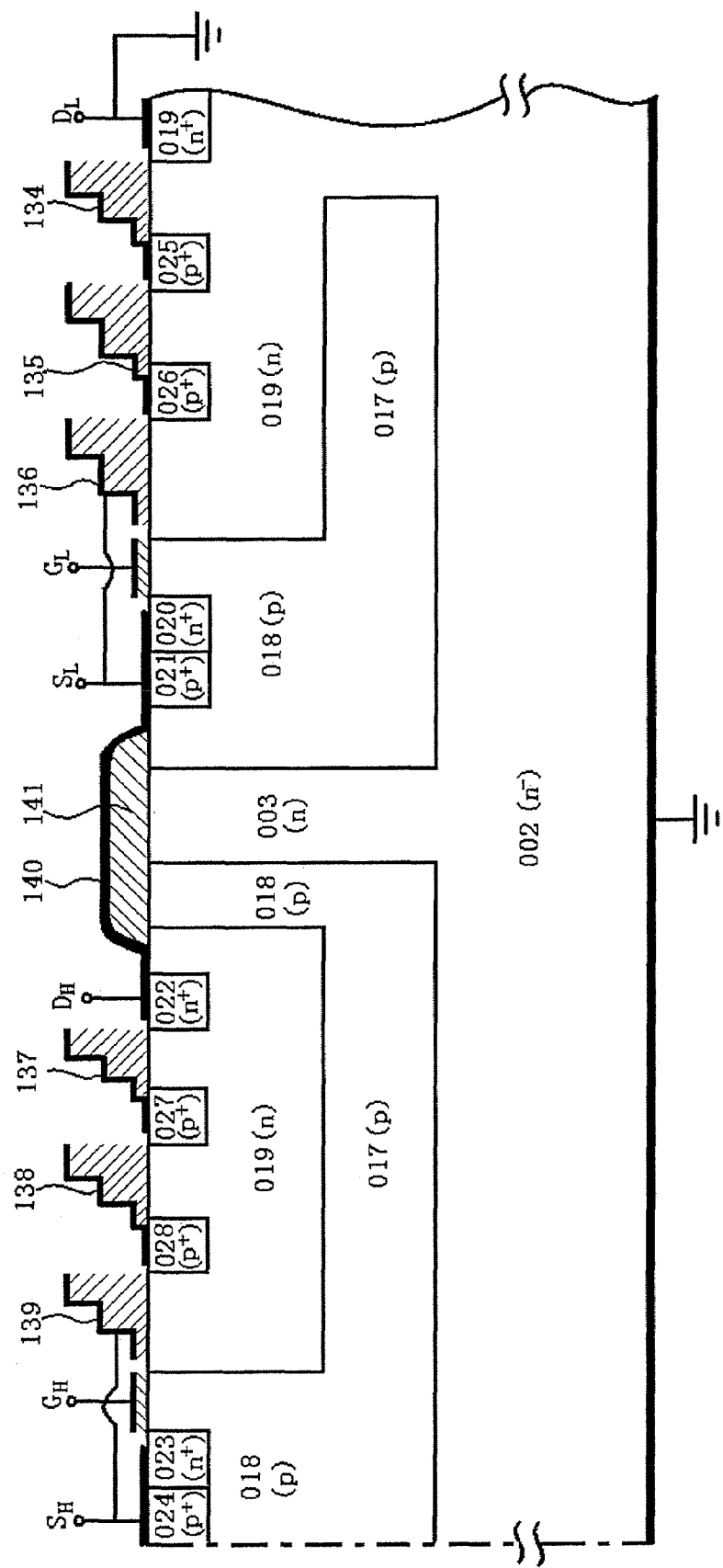

FIG. 11 shows schematically the structures of a high-side MOST and a low-side MOST having a common n-type substrate and using terrace field plates and floating field limiting rings forming the surface voltage sustaining regions.

Figure 12:
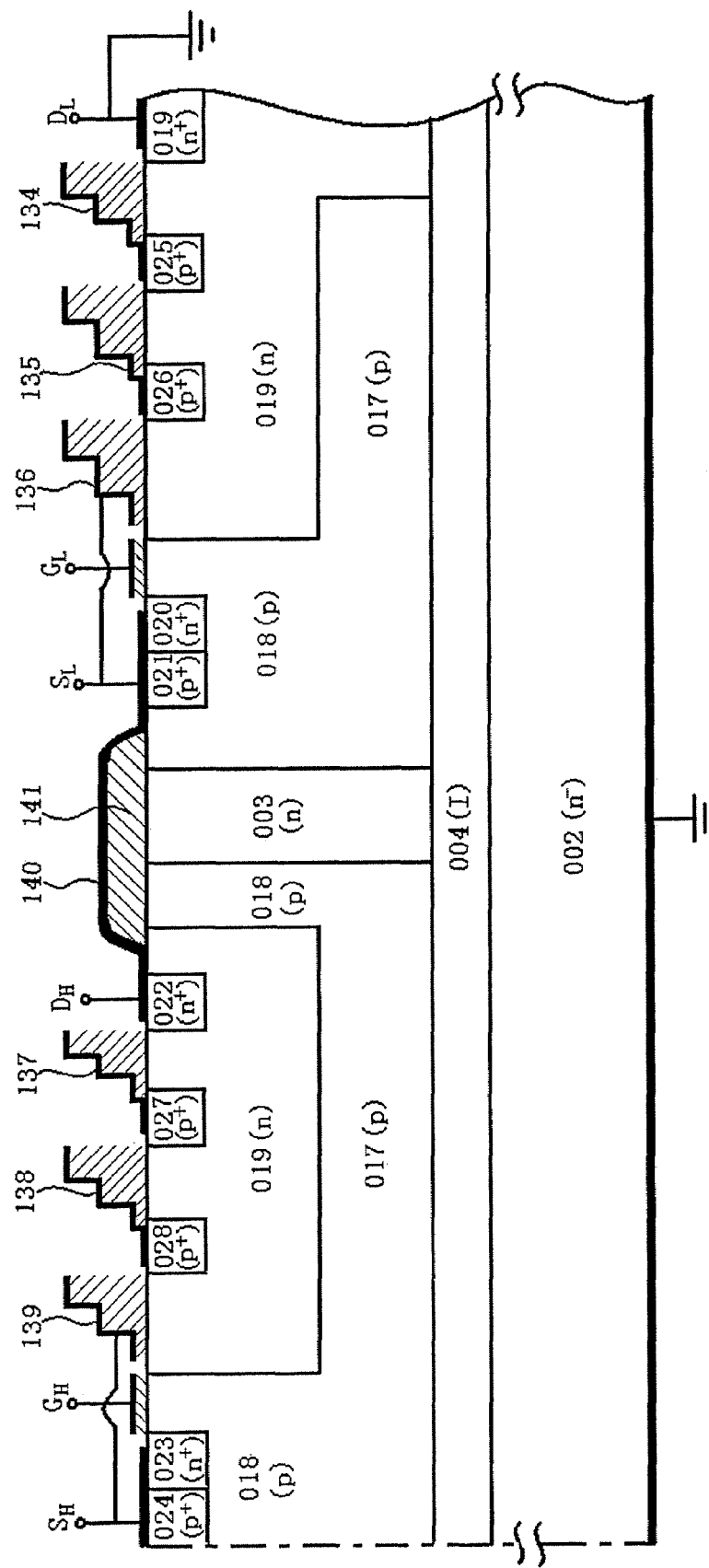

FIG. 12 shows schematically the structures of a high-side MOST and a low-side MOST different to FIG. 11 in that there is a thin insulator layer I between the substrate and the surface voltage-sustaining region.

DESCRIPTION OF THE PREFERRED EMBODIMENTS

Figure 1A:
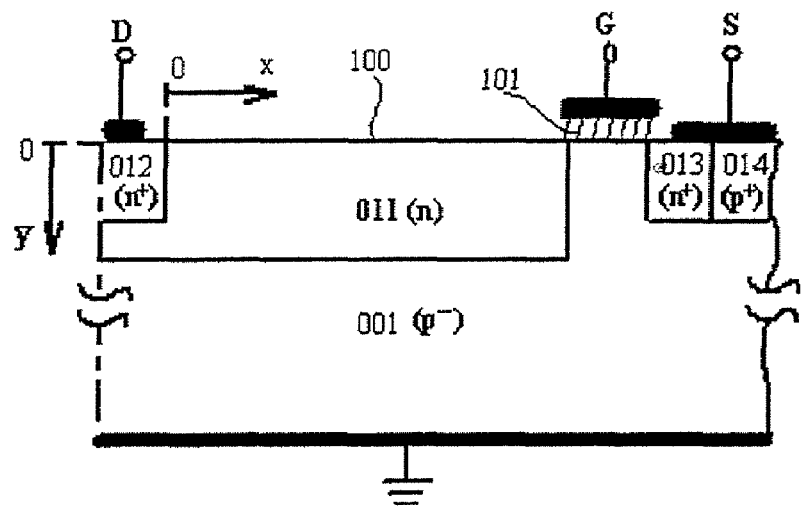
FIG. 1 shows schematically the structure, the flux density and the potential distribution of the surface voltage-sustaining region of the lateral device.
Figure 1B:
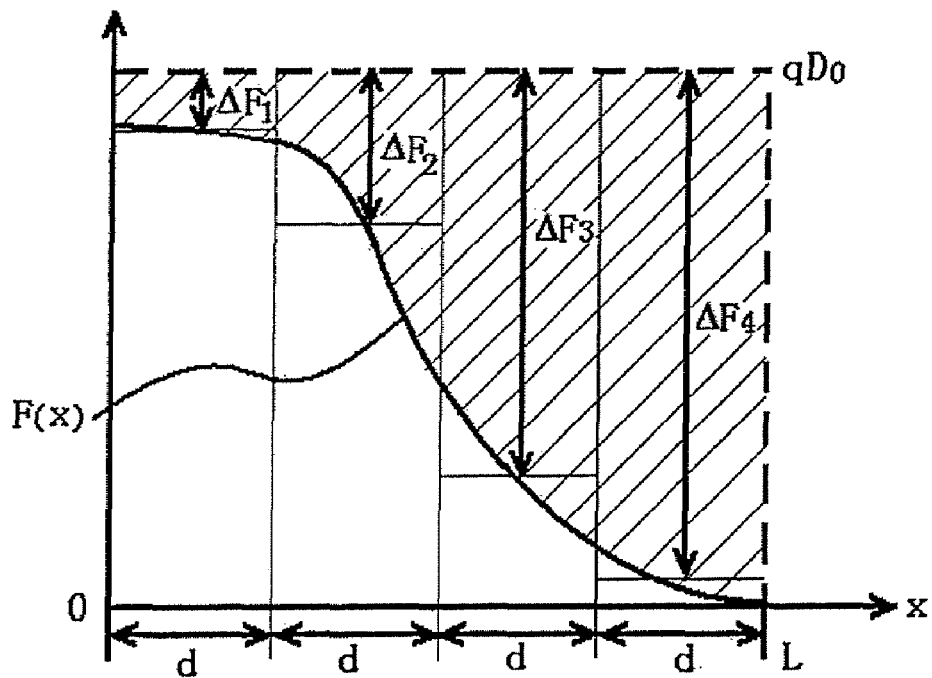
Figure 1C:
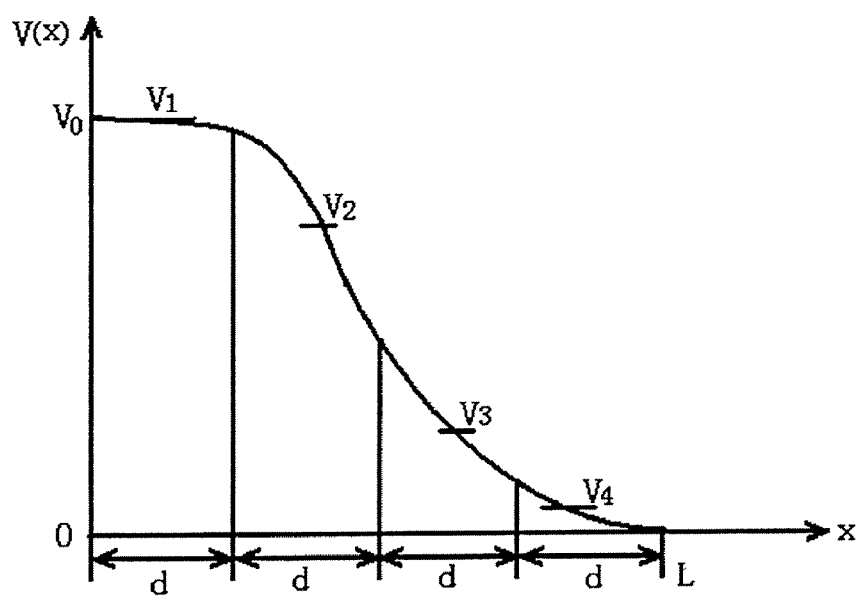

FIG. 1 (a) shows schematically the structure of a lateral MOST, where p$^-$-region 001 is the substrate, n-region 011 is the surface voltage-sustaining region, also called drift region, D, S and G stand for drain, source and gate electrodes respectively. The shaded area 101 is the gate oxide layer or the gate insulator layer. D is connected to n$^+$-drain region 012, S is connected to n$^+$-source region 013 which is connected to p$^+$-source contact region 014 and thus connected to p$^-$-substrate region 001. According to Ref [1] and [2], in the ideal case, the electric flux density produced by the n-type voltage-sustaining region is F(x) shown as solid line in FIG. 1(b), where the x-axis is shown in FIG. 1(a). F(x) has its maximum value, about $2\in_s V_B/W_{pp}$, at the place x=0, where $\in_s$ is the permittivity of the semiconductor, $V_B$ is the breakdown voltage and $W_{pp}$ is the thickness of the depletion layer of a one-sided abrupt parallel-plane junction made by the same substrate under the breakdown voltage $V_B$. Assuming the real technology can produce an average donor density of n-region 011 being $D_0$, then the electric flux density is $qD_0$, which is shown as dash-line in FIG. 1(b). The dash-line has a vertical distance to the solid-line, and the shaded area between these two lines in the figure illustrate the difference between the ordinates of both lines. Assuming the voltage-sustaining n-region 011 is divided into four equal distance sections and each has a width of d, then the average difference of the electric fluxes densities are $\Delta F_1$, $\Delta F_2$, $\Delta F_3$ and $\Delta F_4$, respectively. According to the purpose of this invention, the flux corresponding to $\Delta F_1, \Delta F_2, \Delta F_3$ and $\Delta F_4$ are excess ones and should be eliminated through the charging of the condenser on the surface of the semiconductor. FIG. 1(c) shows potential distribution V(x) on the plane of y=0 in the ideal case, where the potential of the un-depleted neutral region of the p$^-$-substrate, 001, is taken as reference, i.e., V=0. The ordinate y has been shown in FIG. 1(a). $V_1, V_2, V_3$ and $V_4$ in FIG. 1(c) stand for the average potentials of the four sections of the surface voltage-sustaining region respectively. $V_0$ is FIG. 1(c) stands for the highest potential of the voltage-sustaining region of the device.

Figure 2A:
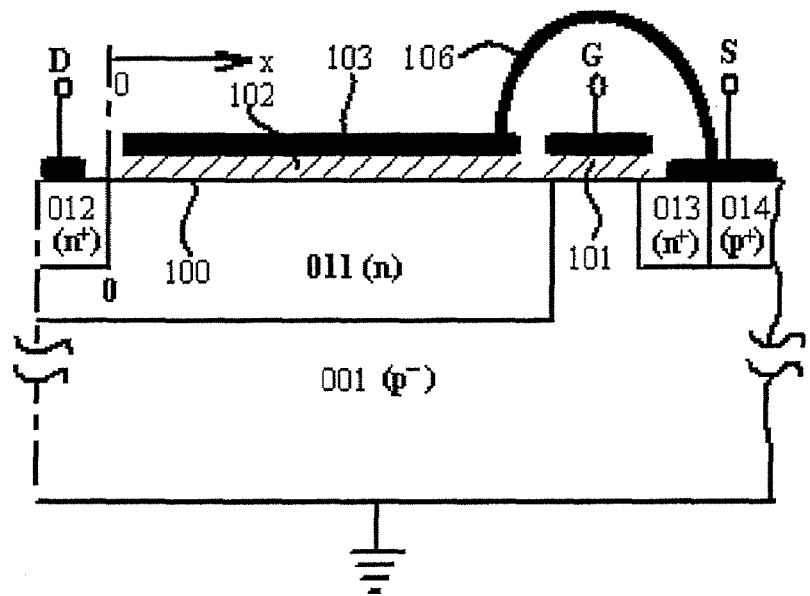
Figure 2B:
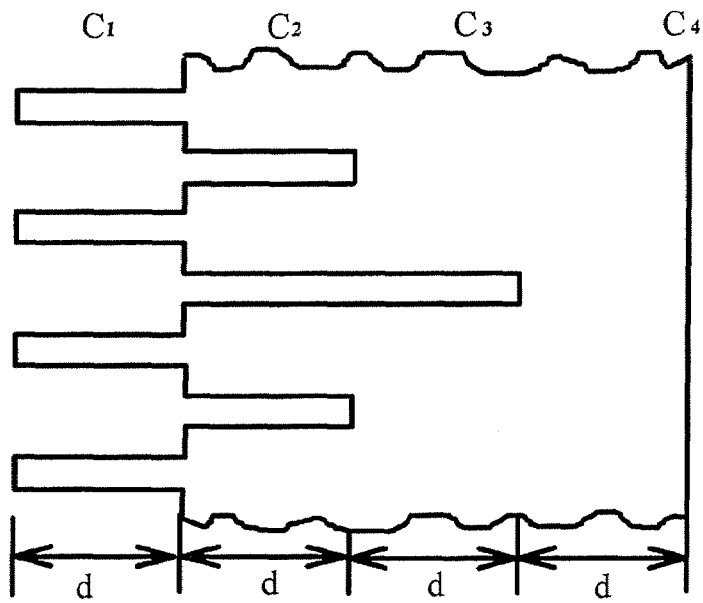

Note that according to Ref. [1] and Ref. [2], there is a method to obtain an approximate optimum variation lateral doping. That is, it is only required that in an area with dimension much smaller than $W_{pp}$, the average value of electric flux density emitted from the surface voltage-sustaining region into the substrate is approximately equal to the F(x), shown in FIG. 1(b). FIG. 2(a) shows schematically the structure of a lateral MOST, where D, S and G stand for drain, source and gate electrodes respectively. The shaded area 101 in this figure is the gate oxide layer or gate insulator layer. Drain electrode D is connected to n$^+$-drain region 012, source electrode S is connected to n$^+$-source region 013 and through p$^+$-region 014 directly connected to p$^-$-substrate 001. An oxide layer 102 is set on the top of semiconductor surface 100, and a conductive metal or heavily-doped polysilicon forming a field plate 103 is set on the top of 102. This field plate is connected to the source electrode S through outer connection 106 shown also in FIG. 2(a). A MOS capacitor with average value varied with distance x, which is shown as the abscissa of an x-axis in FIG. 2(a), can be made by varying the fill factor r of the field plate. Since the capacitance between the field plate and semiconductor surface 100 in unit area is $\epsilon_{ox}/t_{ox}$, where $\epsilon_{ox}$ is the permittivity of the oxide layer and $t_{ox}$ is the thickness of oxide layer, the average value of the capacitance in unit area, $C(x)$, is $r \times \epsilon_{ox}/t_{ox}$. FIG. 2(b) shows a top view of the field plate having such a variation of capacitance. This field plate has four sections, each section has a width of d. In the leftmost portion, the value of r is the smallest. Then, the value of r increases towards the right direction. In the rightest portion, r has its maximum value, 1. According to FIG. 1(c) and FIG. 1(b), the semiconductor surface should have a voltage $V(x)$ and a flux density flow of $F(x)$ to the substrate, it turns out that $$r \times \varepsilon_{ox}/t_{ox} = \frac{q(D_0 - D(x))}{V(x)}$$

since the condenser made by the field plate should take a flux density of $q(D_0-D(x))$, where $qD_0$ is the flux density produced by the n-region 011 and $qD(x)=F(x)$ is the flux density needed to flow into the substrate. Obviously, the closer the place to the drain is, the larger the value of $V(x)$ is, and thus the smaller the values of $(D_0-D(x))$ and r are.

The average electric flux densities need to be extracted by the four sections of field plates of FIG. 2 have been already shown in FIG. 1(b) and denoted as $\Delta F_1$, $\Delta F_2$, $\Delta F_3$ and $\Delta F_4$ respectively. From FIG. 1(c), the average values of the surface potential of these four sections can be found as $V_1$, $V_2$, $V_3$ and $V_4$, respectively. Thus, the values of r at these four sections can be determined.

Figure 2C:
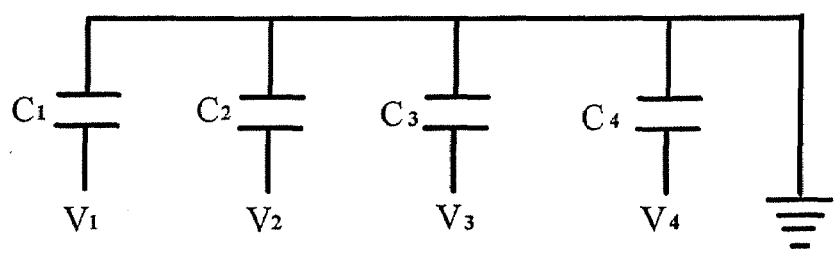

Obviously, an equivalent circuit of the four capacitances $C_1$ $C_2$, $C_3$ and $C_4$ with respect to the corresponding potentials $V_1$, $V_2$, $V_3$ and $V_4$ can be expressed and is shown in FIG. 2(c).

However, the above method may not be appropriate in some cases. For instance, when the value $V(x=0)$ of the device is very large but the available $t_{ox}$ is not large enough, then the field in the oxide can be larger than the dielectric strength. Also, when the fill factor is very small, then a very high field may be produced at the tip or the corner or the edge of the interdigitated plate field plate. Note that once the local field exceeds the field strength of the oxide, then breakdown occurs and damage induced is irreversible.

In order to overcome that problem, the multiple conductive layers existing in many CMOS technologies can be used, so that the thickness of oxide layer can be varied and the necessary capacitance variation can be realized. FIG. 3 shows an example of such a method applied to a lateral MOST, where D, S and G are drain, source and gate electrodes respectively. The shaded area 101 is the gate oxide layer or gate insulator layer. Drain electrode D is connected to nm-drain region 012, source electrode S is connected to n$^+$-source region 013 and through p$^+$-region 014 connected directly to the p$^-$-substrate 001. The structure consists of a field plate 104 and a dielectric layer 105 underneath it to separate it from the semiconductor. The dielectric layer 105 has four sections with different thicknesses. This field plate has an outer connection 106 connected to the source electrode, making its potential to be the same as the substrate, i.e., equals to zero. Such a field plate having a terrace structure is called terrace field plate hereinafter. The marks $C_1$, $C_2$, $C_3$ and $C_4$ stand for the capacitance in unit area between the sections of the field plate and the semiconductor surface. Thus, FIG. 2(c) can be applied to this case. Clearly, the values of the capacitances $C_1$, $C_2$, $C_3$ and $C_4$ should be increased in that order and the applied voltage $V_1$, $V_2$, $V_3$ and $V_4$ decreases in that order. Therefore, the flux density absorbed from the surface of the semiconductor by the plate increases from the subscript 1 to subscript 4.

Of course, the field plate in FIG. 3 can also be made with the fill factors varies from 0 to 1, similar to that shown in FIG. 2(b).

In order to avoid the field at the places of tips or corners or edges of the strip of field plate being too large, floating field plate can be used as shown in FIG. 4(a). This figure schematically shows a structure of lateral MOST, where D, S and G are drain, source and gate electrodes respectively. The shaded area 101 is the gate oxide layer or gate insulator layer. D is connected to n$^+$-drain region 012, S is connected to n$^+$-source region 013 and also connected to p$^-$-substrate 001 via p$^+$-region 014. The topmost field plate 104 is formed in an interdigitated shape shown like in FIG. 2(b). There are three field plates under it, namely, 107, 108 and 109. Their layouts are not interdigitated. From the semiconductor surface to the topmost field plate, there are two capacitances in series connection, which is equivalent to one capacitance. The equivalent circuit of such case is also like FIG. 2(c) shown.

Another method to make floating field plates have the similar effect of FIG. 4(a) is shown in FIG. 4(b). In this figure, a multiple layer of floating field plates is used. In the leftmost portion of the surface voltage-sustaining region, it has two floating field plates 110 and 111 placed above the first floating field plates 107. Besides, there is one grounded field plate 104 at the top. Next to the leftmost, there are two floating field plates 110 and 111, and one topmost 104. Still next, there is only one floating field plate 111 under the grounded plate 104. Note that the first floating field plate 107 absorbs electric flux $\Delta F_1$ of the leftmost shaded portion of FIG. 1(b), this flux should release to the floating field plate 110 since 107 should be neutral as a whole. In addition to that flux, the plate 110 also absorbs a flux of $\Delta F_2$ shown in next to the leftmost shaded portion of FIG. 1(b). Therefore, the floating field plate 110 must emit a sum of both fluxes to the floating field plate 111. A similar argument of 110 can be applied to 111. It turns out that the floating field plates absorb more and more flux from the semiconductor according to the order of 107, 110, 111. If all the voltages between every two neighboring floating field plates are the same, then the coupling capacitance should be increased in the same order. FIG. 4(b) satisfies such a requirement.

In the case of some coupling capacitance of FIG. 4(b) needed to be even smaller, then one can use the method shown FIG. 2(b).

Of course, the number of sections of the surface voltage-sustaining region is not necessary being four, it can be more or less. The thickness of the oxide layer also can be different. Moreover, the silicon dioxide can be replaced by other insulator layer. Especially, it is not necessary for the semiconductor surface voltage-sustaining region to have a uniform doping density. It should also be pointed out that according to Ref. [1, 2 and 3], the average electric flux density emitted from the surface voltage-sustaining region means an average effective value taken in a size much smaller than $W_{pp}$.

However, the method shown in FIG. 4(b) may still have problem in that the maximum available thickness of the oxide layer is still not enough to sustain a high voltage. For example, if the maximum thickness $t_{ox}$ of the oxide is 1 μm, i.e., $t_{ox}=1$ μm, and the dielectric strength is $5 \times 10^6$ V/cm, the voltage can be achieved is 500V and the flux density can be absorbed by the field plate is $F=\epsilon_{ox} \times V/t_{ox}$, where $\epsilon_{ox}$ is the permittivity of silicon dioxide and equals to $3.9 \times 8.85 \times 10^{-14}$ F/cm. Thus, the flux density can be absorbed is equivalent to a dose of impurity of $F/q=1 \times 10^{13}$ cm$^{-2}$. This flux density is normally too large.

In order to overcome this restriction, some methods stated in the following are proposed in this invention.

FIG. 5(a) shows an example of using a number of n of floating field plate ($P_1$, $P_2$, $P_3$, ... $P_{n-1}$, $P_n$) and one grounded field plate $P_G$ to form a high-voltage diode, where A and K stand for anode and cathode respectively. The cathode K is connected to $n^+$-region 012 and the anode A connected to $p^+$-region 014. If the voltage can be sustained between each field plate and the semiconductor surface is $\Delta V$ and that between two neighboring field plates is $\Delta V_F$, then the total voltage can be sustained between cathode K and the substrate is $n \times \Delta V_F + \Delta V$, which increases as the number n increases.

Since floating field plates with potential close to the substrate should have larger coupling capacitance, FIG. 5(a) cannot satisfy such a requirement.

Yet, larger coupling capacitances can be fulfilled by extending to the area outside of the voltage-sustaining region. FIG. 5(b) shows schematically a high-voltage diode by using such a method, where A and K are the anode and cathode electrodes respectively. Cathode K is connected to $n^+$-region 012 and anode A is connected to $p^+$-region 014. This device has a grounded field plate 116 and floating field plates 112, 113, 114 and 115, where 114 is connected through outer connection 119 to plate 118 and 115 is connected through outer connection 120 to plate 117.

FIG. 5(c) shows another example of using multiple floating field plates. It is somewhat similar to FIG. 5(a) except that such a structure can use less number of plates under the same breakdown voltage. In other words, with floating field plates of number n, the total voltage can be sustained is $(n+1)\Delta V_F + \Delta V$ now. In comparison with FIG. 5(a), the effect is like an increase of an additional floating field plate of FIG. 5(a).

An estimation of the parameters of the field plates shown in FIG. 5 can be done by referring the equivalent circuit showing in FIG. 6. In this figure, $C_i$ (i=1, 2, 3, ... n) stands for the capacitance in unit area between the i-th plate and the semiconductor surface, $d_i$ (i=1, 2, ... n) stands for the width of the i-th section, $\Delta F_i$ and $V_i$ stand for the average electric flux density extracted from the i-th section of the semiconductor surface and the average surface potential respectively. The average potential of the semiconductor surface decreases according to the order of i=1, 2, 3, .... Thus, the voltage across the capacitor $C_i$ is $$V_i - U_i = \Delta F_i / C_i$$

Where $U_i$ is the potential of the i-th floating field plate. It turns out that the voltage across the coupling capacitor $C_{i,i+1}$ between the i-th plate and the (i+1)-th plate is $$(U_i - U_{i+1}) = V_i - V_{i+1} - (\Delta F_i / C_i - \Delta F_{i+1} / C_{i+1})$$

Since the increment of the charge of the coupling capacitor in unit area caused by the i-th section is $\Delta F_i$ and the charge on the coupling capacitor is the sum of the charge absorbed by the i-th section and charges absorbed by all sections before it, the charge on $C_{i,i+1}$ is $$\Delta F_1 + \Delta F_2 + ... + \Delta F_i$$

It turns out that the value of $C_{i,i+1}$ is $$C_{i,i+1}(\Delta F_1 + \Delta F_2 + ... + \Delta F_i)/(U_i - U_{i+1}) = (\Delta F_1 + \Delta F_2 + ... \Delta F_i)/(V_i - \Delta F_i / C_i - V_{i+1} + \Delta F_{i+1} / C_{i+1})$$

The estimation values of $C_{i,i+1}$ can be taken as a first approximation for a numerical simulation to obtain the more precise values.

Obviously, the field plates can also introduce electric flux into the semiconductor. FIG. 7(a) shows an example of high-voltage $n^+$-p diode made on a $p^-$-substrate 001, where A and K has the same meanings as before. K is connected to $n^+$-region 012 and A is connected to $p^+$-region 014. There is no surface n-region in the surface voltage-sustaining region. The only $n^+$-region 012 is for cathode contact, which is not included in the surface voltage-sustaining region. In this example, one field plate 121 connected to the cathode K and the remaining three field plates, 122, 123 and 124, are floating. The surface has four sections, the leftmost field plate 121 has a potential higher than the average potential $V_1$ of the semiconductor surface, and therefore introduced electric flux from the field plate through the oxide layer under it, then into the semiconductor. This plate has a potential higher than that of the floating field plate 122, so, some flux flow from 121 through oxide layer above it and then into 122. The floating field plate 122 has a potential in turn higher than the average potential $V_2$ of the semiconductor surface below it, so some flux flow from 122 into the second section of semiconductor surface, and so on and so forth.

FIG. 7(b) shows another example. This structure has a field plate 125, connected to the cathode K and three floating field plates 126, 127 and 128. Although the total number of plates is the same as FIG. 7(a), the voltage can be sustained here is $4 \times \Delta V_F + \Delta V$, whereas in FIG. 7(a), it is $3 \times \Delta V_F + \Delta V$.

FIG. 7(c) shows the equivalent circuit applicable to both FIG. 7(a) and FIG. 7(b). Where $C_i$ represents the product of the capacitance in unit area times the width of section i, this product equivalent to $C_i d_i$ shown in FIG. 6. $C_{i,i+1}$ in FIG. 7(c) represents the capacitance between the i-th floating field plate and the (i+1)-th floating field plate in a unit length perpendicular to the paper. $V_i$ and $U_i$ have the same meanings as in FIG. 6 and $V_0$ is the cathode voltage of the diode. Evidently, for the case of FIG. 7(a), $U_1 = V_0$. For the case of FIG. 7(b) $C_1 = 0$, i.e., $C_1$ does not exist.

The voltage across $C_i$ is $U_i - V_i$, which makes a electric flux $F_i = (U_i - V_i) \times C_i$ to the semiconductor surface in unit length perpendicular to the paper, corresponding to $\Delta F_i \times d_i$ in FIG. 6.

Obviously, the voltage across the coupling capacitor $C_{i+1}$ is $$(U_i - U_{i+1}) = V_i - V_{i+1} + F_i / C_i - F_{i+1} / C_{i+1}$$

And the charge on $C_{i,i+1}$ is the sum of charges on the field plates starting from the (i+1)-th section to the last field plate, i.e., $$F_{i+1} + F_{i+2} + ... + F_n$$

Thus, the value of $C_{i,i+1}$ needed can be determined by the following equation:

$$C_{i,i+1} = (F_{i+1} + F_{i+2} + ... + F_n)/(U_i - U_{i+1})$$

In above, the potentials of each floating field plates are supposed to be certain values when the diode or the MOST is under a certain reverse voltage. However, if the insulator layer is not perfect, then a leakage current occurs and the floating field plates will be charged or discharged. Eventually, the values of potentials of the floating field plates cannot be the values required when the voltage applied to the device varies.

One method to avoid such effect is to use an outer circuit to switch all of the floating field plates to the ground, namely to the substrate, during the device is turned-on with the voltage across the surface voltage-sustaining region being very low or when it is not been used. Another method is to use an outer circuit to connect all floating field plates to required potentials. Then the plates are not floating anymore.

This invention provides an approach to solve the leakage problem. The method is to connect each plate to a floating field limiting ring. Needless to say, a field plate connected only to a floating field limiting ring is still a floating field plate. FIG. 8 shows examples of such method. FIG. 8(a) shows schematically a structure of a high voltage lateral n$^+$-p diode made on a p$^-$-substrate 001, wherein floating field limiting rings are set. In this figure, A and K represent anode and cathode electrodes respectively. A is connected to p$^+$-region 014 and to field plate 131 as well. The plates 129 and 130 are connected to p$^+$-floating field limiting rings 015 and 016 respectively. When the cathode K has a high positive potential with respect to the anode A, each p$^+$-floating field limiting ring has a negative potential in comparison to the n-region on its right side, this is because some holes have left the p$^+$-ring and flown to the place of lower potential. However, the p$^+$-floating field limiting rings can only have about one volt less than its neighboring n-region because it becomes difficult to inject holes to the neighboring n-region when the potential barrier is much larger than one volt. Note that one volt is much less than the voltage across the voltage-sustaining region in high-voltage devices and can be neglected.

Thus, suppose the width and the thickness of each floating field limiting ring are much smaller than those of its enclosing n-region in the surface voltage-sustaining region, then the structure shown in FIG. 8(a) can achieve a breakdown voltage of that of an ideal VLF, so far as all the p$^+$-rings have been placed correctly.

A little leakage current between a field plate and the semiconductor surface has little influence to the potential of the field plate, in the case of that the field plate is connected to a floating field limiting ring. To make this in effective, it is appropriate to set the field limiting rings only in certain portions of an area instead of all area having a certain potential. FIG. 8(b) shows an example of finger edge of a surface voltage-sustaining region where there is no floating field limiting ring. The rings are set at the finger ends. The cross-section view of such ends can also be represented by FIG. 8(a). Then the top view of such ends is shown in FIG. 8(c). In this top view, floating field limiting rings cannot be shown because they are covered by plates. Actually, there are two floating p$^+$-rings, 015 and 016, at the finger end; they have potentials $U_1$ and $U_2$, respectively. Two field plates, 129 and 130, are placed on them. The ring 015 and ring 016 do not exist in the finger edge.

FIG. 9 shows schematically a lateral MOST using above method, where, on the p$^-$-substrate 001, an n-type region 011 constructs the voltage-sustaining layer. The marks D, S and G stand for drain, source and gate electrodes respectively. The shaded area 101 is gate oxide layer or gate insulator layer. The drain electrode D is connected to the n$^+$-drain region 012, the source electrode S is connected to n$^+$-source region 013 and p$^+$-region 014, thus connected to the p$^-$-substrate 001. This device has two terrace field plates 132 and 133. FIG. 9(a) shows the structure at the finger edge, where the terrace field plates 132 and 133 are connected to two p$^+$-floating field limiting rings 015 and 016. These two rings are set at the finger end shown in FIG. 9(b).

The field plates can be connected to some floating field limiting rings that are set in other device instead of in the device itself. FIG. 10(a) shows an example to illustrate this point. In this figure, there are two lateral diodes. The device in the left dash-dotted block, 201, is a small round n$^+$-p diode, which is not an interdigitated layout. The device in the right dash-dotted block, 202, is a large n$^+$-p diode, has an interdigitated layout. In both devices, A and K are anode electrode and cathode electrode, respectively. The cathode electrode K is connected to n$^+$-region 012. The anode electrode A is connected to p$^+$-region 014. The floating field limiting rings, p$^+$-region 015 and 016, are connected with terrace field plates 132 and 133 respectively. The field plates 132 and 133 of the small device 201 are connected to the field plates 132 and 133 of the large device through outer connections. FIG. 10(b) shows the top view with outer connections of both 132 and both 133. Both devices are applied with the same voltage and the floating field limiting rings produce certain voltages to the field plates. When the devices have no applied voltage on them or when they are conducting and the voltage across the surface voltage sustaining region is very small, then all potentials of the floating field limiting rings are set to a very small value. The charges of the floating field plates, if any, can be lead to the substrate.

The examples of surface voltage-sustaining region so far are limited to either a case of an n-region (011) being dosed heavier than that in the ideal case, or a case of no n-region in the surface voltage-sustaining region at all (FIG. 7). It is apparent that, basically, the techniques presented in this invention can be applied to other complicated cases, e.g., an n-region existing only partly in the surface voltage-sustaining region; or a non-uniformly dosed n-region in the surface voltage-sustaining region; or a combination of n-regions and p-regions in the surface voltage-sustaining region, etc., etc.

It is also evident that the variation of the capacitance in unit area is not restricted to only by variation of the fill-factor of the field plate(s) and/or the total thickness of the insulator layer. It can also be made by a variation of electric permittivity of the insulator, or use this as an additional measure.

Although the examples of the devices discussed so far are based on p$^-$-substrate, needless to say, the principle can be applied to devices based on n-substrate.

The surface voltage-sustaining region by taking advantage of optimum variation flux with help of field plates can not only be applied to devices with one electrode connected to the substrate, but also be applied to high-sided devices in totem pole configuration. FIG. 11 shows an example to use such technique for making a high-side n-MOST and a low-side n-MOST. The left part of the figure is a high side n-MOST, the right part is a low-side n-MOST. Both devices are made on an n$^-$-substrate 002. The surface voltage-sustaining regions of both devices include p-region 017 and n-region 019. An n-type region 003 is placed between the two surface voltage-sustaining regions. The symbols D, S and G stand for drain, source and gate electrodes, respectively, whereas the subscript H represents high side and L represents low side. The drain electrode $D_L$ of the low-side MOST is connected to n$^+$-drain region 019, the source electrode $S_L$ of the low-side MOST is connected to n$^+$-source region 020, and connected to source-body p-region 018 through p$^+$-region 021. The drain electrode $D_H$ of the high-side MOST is connected to n$^+$-drain region 022, the source electrode $S_H$ of the high-side MOST is connected to n$^+$-source region 023 and connected to source body p-region 018 through p$^+$-region 024. The surface voltage-sustaining region of the low-side MOST has three terrace field plates, namely 134, 135 and 136, where 136 is connected to source electrode $S_L$ through outer connection, 134 and 135 are connected to the floating field limiting rings, 025 and 026, respectively. Similarly, the surface voltage-sustaining region of the high-side MOST has also three terrace field plates, namely 137, 138 and 139, where 139 is connected to source electrode $S_H$ through outer connection, 138 and 139 are connected to the floating field limiting rings 027 and 028 respectively.

The structure shown in FIG. 11 is similar to FIG. 14 of Ref. [5] in its function. FIG. 14 of Ref. [5] is a modification of FIG. 11 of that reference for increasing the dose of n-drift region and thus to decrease the specific on-resistance, where the effect of an increment of dose is compensated by the p-region on its top. In this invention, a remaining of dose of n-drift region is offset by the flux taken out from the semiconductor surface by the field plate.

As pointed out in Ref. [4] and Ref. [5], an isolation region is necessary in between the high-side and the low-side. In FIG. 11, this isolation region is constructed by the region starting from the left of p$^+$-region 021 of low-side device to the right of n$^+$-region 022. A field plate 140 is covered on this isolation region and also makes a connection between S$_L$ and D$_H$. This field plate helps to isolate the high-side and the low-side by changing the flux of the n-region 003 through isolation layer 141.

Naturally, the technique proposed by this invention can also be applied to the case that an insulator exists between the substrate and the surface voltage-sustaining region. FIG. 12 shows an example of this case. The difference to FIG. 11 is only in that an insulator (I) layer, 004 separates the surface voltage-sustaining region and the substrate.

Of course, the techniques proposed in this invention can be applied not only to lateral diode and lateral MOST, but also to other lateral devices. Even more, they can be used to be an edge termination technique for vertical devices.

Besides, the technique of bird beak in integrated circuit can be used to field plates to avoid producing a local high electric field around the tip or the corner or the edge.

The techniques proposed by this invention have been illustrated by many examples of applications. It should be understood that various changes and modifications to the presently preferred embodiments described herein will be apparent to those skilled in the art. Such changes and modifications may be made without departing from the spirit and scope of the present invention and without diminishing its attendant advantages. It is therefore, intended that such changes and modifications be covered by the appended claims.

The invention claimed is:

1. A semiconductor lateral device formed on a surface of a lightly-doped semiconductor substrate of a first conductivity type comprising:
a device edge region of a semiconductor of the first conductivity type connected to a first electrode, wherein said device edge region and said electrode both encircle the semiconductor lateral device along a portion of the outer-edge of the semiconductor lateral device;
a device central region of a semiconductor of a second conductivity type connected to a second electrode and located in the center of the semiconductor lateral device and enclosed by said device edge region;
a surface voltage-sustaining region located on said substrate comprising:
at least a semiconductor region of the second conductivity type located between said device central region and said device edge region,
at least an insulator region covering at least a portion of the surface of the semiconductor region of the second conductivity type and varying in thickness and/or electric permittivity in the direction from said device central region to said device edge region,
at least one conductive layer(s) partly covering the insulator and forming at least one terrace field plate, and
at least one semiconductor region of the first conductivity type surrounded by the semiconductor region of the second conductivity type except where it is connected to at least one terrace field plate,
where the part of the terrace field plate covering the insulator is vertically positioned above a portion being immersed in said insulator of a neighboring terrace field plate;
wherein said semiconductor region(s) of the first conductivity type inside the surface voltage-sustaining region is(are) not fully depleted under a reverse voltage applied across said second electrode and said first electrode, and the electric potential of the non-depleted region of it(them) is(are) floating.

2. A semiconductor device according to claim 1,
wherein under a maximum reverse voltage close to a breakdown voltage applied across said second electrode and said first electrode, an effective density of electric flux of first type emitted from said surface voltage-sustaining region into said substrate decreases gradually or stepwisely from an average value of about $2\in_s V_B/W_{pp}$ to an average value of about zero as increasing of distance to said device central region; where $\in_s$ is a permittivity of the semiconductor, $V_B$ is said maximum reverse voltage and $W_{pp}$ is a depletion width of an one sided abrupt parallel plane junction made by said substrate under reverse voltage $V_B$;
where said average values are taken in an area having a lateral dimension smaller than $W_{pp}$;
said surface voltage-sustaining layer has a vertical dimension smaller than $W_{pp}$;
when said substrate is a p-type semiconductor, said electric flux of first type means a flux generated by positive charges, and said reverse voltage applied across said second electrode and said first electrode are positive voltage;
when said substrate is an n-type semiconductor, said electric flux of first type means a flux generated by negative charges, and said reverse voltage applied across said second electrode and said first electrode are negative voltage.

3. A semiconductor device according to claim 1, wherein at least one of the terrace field plates is connected to said first electrode.

4. A semiconductor device according to claim 1, wherein at least one of the terrace field plates is connected to said second electrode.

5. Two semiconductor devices according to claim 1, wherein both can sustain the same reverse voltage; and one has a larger surface area, another has a smaller surface area; wherein said smaller surface area device has at least one region of a conductivity type located on a top of another region of different conductivity type, where the former region has smaller lateral and vertical sizes is not fully depleted and remains partly a neutral and floating region(s) when said reverse voltage is applied across said surface voltage-sustaining region; wherein each terrace field plate of said smaller area device is connected to certain floating region at place most close to it; wherein each terrace field plate of said larger area device is connected to a certain terrace field plate of said smaller area device through outer connections.

6. A semiconductor device according to claim 1, wherein said lateral device is a low-side high voltage MOST or a high-side high voltage MOST.

7. A semiconductor device according to claim 1, wherein said device is a lateral diode.

8. Two semiconductor devices, each according to claim 1, wherein said devices are a lateral low-side device and a lateral high-side device; wherein an insulator layer is between said surface voltage-sustaining region and said substrate; said substrate has an outer connection to connect with said edge region of said low-side device.

9. A semiconductor vertical power device, wherein edge termination is made by a surface voltage-sustaining region according to claim 1.

* * * * *